(12) United States Patent
Hung

(10) Patent No.: US 6,974,334 B2
(45) Date of Patent: Dec. 13, 2005

(54) SEMICONDUCTOR PACKAGE WITH CONNECTOR

(75) Inventor: Chih-Pin Hung, Kaohsiung (TW)

(73) Assignee: Advanced Semiconductor Engineering, Inc., (TW)

( * ) Notice: Subject to any disclaimer, the term of this patent is extended or adjusted under 35 U.S.C. 154(b) by 0 days.

(21) Appl. No.: 10/680,209

(22) Filed: Oct. 8, 2003

(65) Prior Publication Data

US 2004/0087191 A1 May 6, 2004

(30) Foreign Application Priority Data

Nov. 5, 2002 (TW) .............................. 91132997 A

(51) Int. Cl.⁷ ............................................ H01R 12/00
(52) U.S. Cl. ....................... 439/70; 439/76.1; 439/945; 439/629
(58) Field of Search .............................. 439/70, 66–69, 439/71–81, 91, 629, 945, 946; 257/730, 731, 257/678; 361/785–786, 789, 718–720; 174/260

(56) References Cited

U.S. PATENT DOCUMENTS

| | | | | |
|---|---|---|---|---|
| 5,157,480 A | * | 10/1992 | McShane et al. | 257/693 |
| 5,808,873 A | * | 9/1998 | Celaya et al. | 361/760 |
| 6,294,731 B1 | * | 9/2001 | Lu et al. | 174/35 R |
| 6,307,749 B1 | * | 10/2001 | Daanen et al. | 361/704 |
| 6,469,909 B2 | * | 10/2002 | Simmons | 361/803 |
| 6,573,609 B2 | * | 6/2003 | Fjelstad et al. | 257/778 |
| 6,633,490 B2 | * | 10/2003 | Centola et al. | 361/785 |

* cited by examiner

Primary Examiner—Gary Paumen
Assistant Examiner—Edwin A. Leon

(57) ABSTRACT

A package for being electrically connected to an external printed wiring board and an external electronic device comprises a substrate, a semiconductor chip, a mold compound, and a connector. The substrate is electrically connected to the external printed wiring board. The semiconductor chip is disposed on and electrically connected to the substrate. The molding compound is used for encapsulating the semiconductor chip. The connector is disposed on the substrate for electrically connecting the semiconductor chip to the external electronic device.

17 Claims, 2 Drawing Sheets

SEMICONDUCTOR PACKAGE WITH CONNECTOR

BACKGROUND OF THE INVENTION

1. Field of the Invention

The present invention relates to a semiconductor package, and more specifically, the present invention relates to a semiconductor package with a connector.

2. Description of the Related Art

The package has four major functions, i.e. signal distribution, power distribution, heat dissipation, and protection. In general, the semiconductor chip is formed into an enclosure, such as a single-chip module (SCM) or a chip carrier, referred to as a first-level package, i.e. the packaging of the semiconductor. These packaged chips, along with other components such as capacitors, resistors, inductors, filters, switches, and optical and RF components, are assembled to a printed wiring board on a second-level packaging.

As electronic devices have become smaller and thinner, the speed and the complexity of IC chip become more and more higher. Semiconductor chips have to provide relatively more leads for inputting or outputting signals. However, the conventional semiconductor package, such as small outline package (SOP), quad flat package (QFP), ball grid array (BAG), is electrically connected just in a single direction. If the electronic devices for being connected to each other are arranged in various directions, the complex arranged connectors and wires must be provided on two printed wiring boards for electrically connecting two printed wiring boards to each other so as to electrically connect the electronic devices to each other.

Accordingly, there exists a need for a semiconductor package which can be electrically connected to external printed wiring boards or electronic devices in various directions.

SUMMARY OF THE INVENTION

It is an object of the present invention to provide a semiconductor package with a connector for being electrically connected to external printed wiring boards or electronic devices in various directions.

In order to achieve the above objects, the present invention provides a package for be electrically connected to an external printed wiring board and an external electronic device. The package comprises a substrate, a semiconductor chip, a mold compound, and a connector. The substrate is electrically connected to the external printed wiring board. The semiconductor chip is disposed on and electrically connected to the substrate. The molding compound is used for encapsulating the semiconductor chip. The connector is disposed on the substrate for electrically connecting the semiconductor chip to the external electronic device.

Accordingly, the semiconductor package according to the present invention is provided with connectors for the multi-direction connection. In particular, the semiconductor package is adapted to the system in package (SiP) for providing an integrated electronic module.

BRIEF DESCRIPTION OF THE DRAWINGS

Other objects, advantages, and novel features of the invention will become more apparent from the following detailed description when taken in conjunction with the accompanying drawing.

DESCRIPTION OF THE PREFERRED EMBODIMENT

Figure 1:
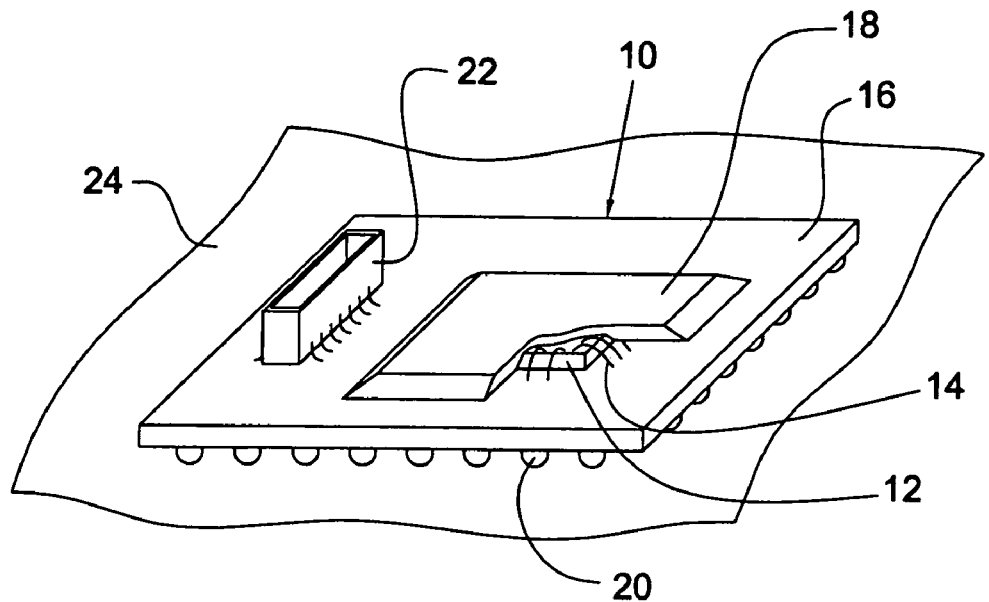
FIG. 1 is a schematic perspective view of a package according to a first embodiment of the present invention.

Referring to FIG. 1, it depicts a semiconductor package 10. The semiconductor package 10 is generally the type of a ball grid array package, which has a semiconductor chip 12 electrically connected to a substrate 16 through bonding wires 14, and a molding compound 18 for encapsulating the semiconductor chip 12 and the bonding wires 14. That is, the semiconductor chip 12 is electrically connected to the substrate 16 by a wire bonding process.

The substrate 16 of the semiconductor package 10 is provided with solder balls 20 electrically connected to the semiconductor chip 12 through vias (not shown) for being electrically connected to a first external printed wiring board 24. A connector 22 is electrically connected to the substrate 16 by the process of the surface mount technology and electrically connected to the semiconductor chip 12 for electrically connecting the semiconductor chip 12 to an external electronic device, such as a second external printed wiring board (not shown). As shown in the figure, the solder balls 20 of the substrate 16 are electrically connected to the first external printed wiring board 24 by way of the bottom of the substrate 16, and the connector 22 is electrically connected to the second external printed wiring board by way of the top of the substrate 16. It will be apparent to those skilled in the art that the connector 22 can be mounted in various directions so that the semiconductor package 10 is electrically connected to the second external printed wiring board in the various directions.

Figure 2:
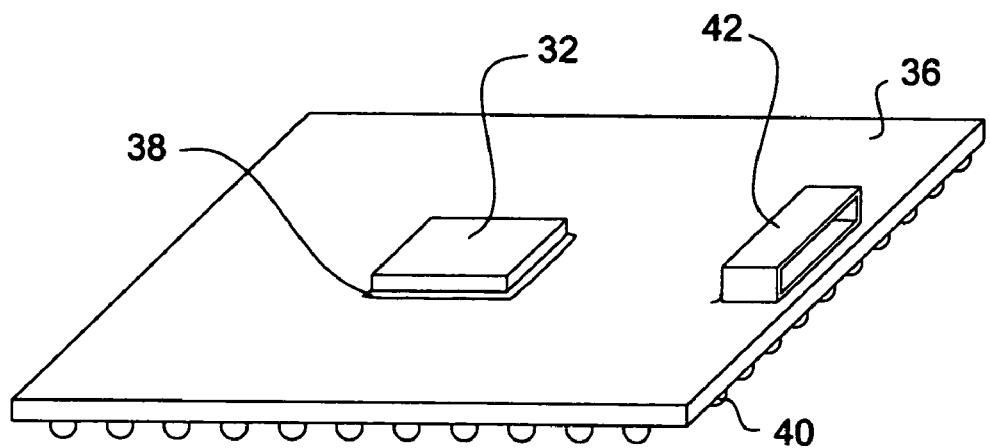
FIG. 2 is a schematic perspective view of a package according to a second embodiment of the present invention.

Referring to FIG. 2, it depicts a semiconductor package 30 according to a second embodiment of the present invention. The semiconductor package 30 is generally the type of a flip chip ball grid array package, which has a semiconductor chip 32 electrically connected to a substrate 36 through bumps (not shown) and a molding compound 38 filled between the semiconductor chip 32 and the substrate 36. That is, the semiconductor 30 is electrically connected to the substrate 36 by the flip chip technology.

The substrate 36 of the semiconductor package 30 is provided with solder balls 40 electrically connected to the semiconductor chip 32 through vias (not shown) for being electrically connected to a first external printed wiring board (not shown). A connector 42 is electrically connected to the periphery of the substrate 36 by the process of the surface mount technology and electrically connected to the semiconductor chip 12 for being electrically connected the semiconductor chip 12 to a second external printed wiring board (not shown) or an external electronic device. As shown in the figure, the solder balls 40 of the substrate 36 are electrically connected to the first external printed wiring board by way of the bottom of the substrate 36, and the connector 42 is electrically connected to the second external printed wiring board by way of the top of the substrate 36.

Figure 3:
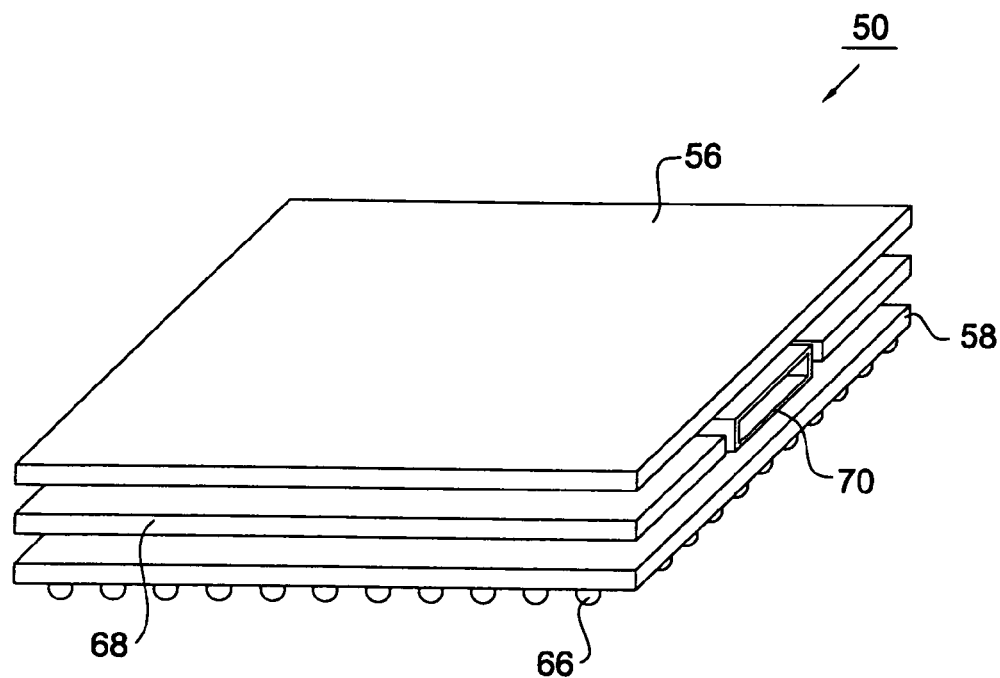
FIG. 3 is a schematic perspective view of a package according to a third embodiment of the present invention.
Figure 4:
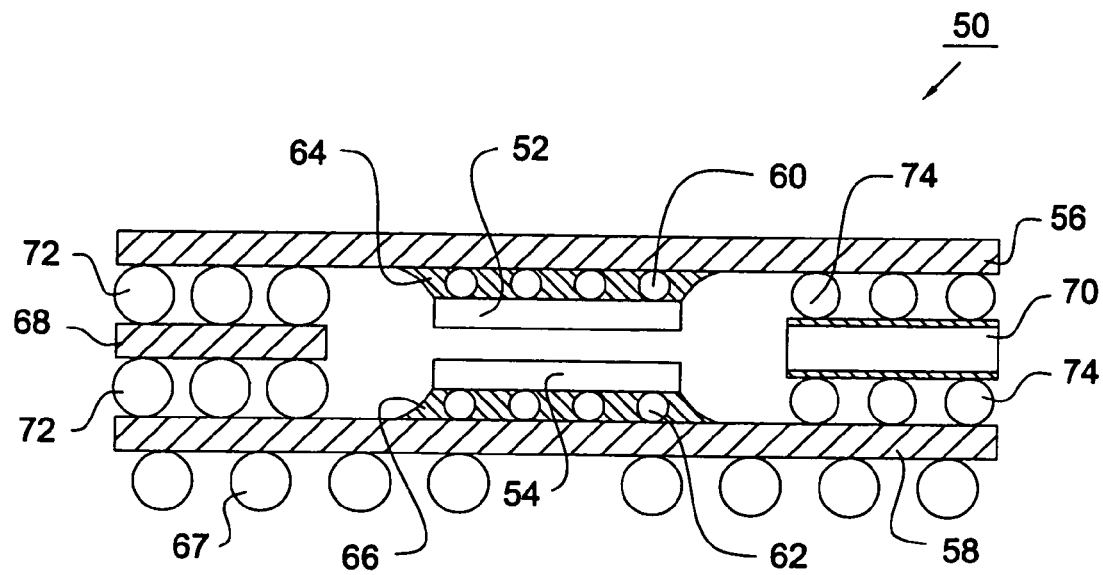
FIG. 4 is a schematic cross sectional view of the package according to the third embodiment of the present invention shown in FIG. 3.

Referring to FIGS. 3 and 4, they depict a semiconductor package 50 according to a third embodiment of the present invention. The semiconductor package 50 has two semiconductor chip 52, 54 respectively electrically connected to a top substrate 56 and a bottom substrate 58 through bumps 60 and bumps 62 and molding compounds 64, 66 respectively filled between the chips 52, 54 and the substrates 56, 58.

The semiconductor package 50 further comprises a medium substrate 68 electrically connected to the top substrate 56 and the bottom substrate 58 through solder balls 72. The medium substrate 68 is generally U-shaped, i.e. the medium substrate 68 has an opening for receiving a connector 70. The bottom substrate 58 is provided with solder ball 67 for being electrically connected to an external printed wiring board (not shown). The connector 70 is electrically connected to the top substrate 56 and the bottom substrate 58 through solder balls 74.

It will be apparent to those skilled in the art that the two chip 52, 54 are electrically connected to the top and bottom substrates 56, 58, respectively, and the top and bottom substrates 56, 58 are electrically connected to one another through the medium substrate 68 and the sold balls 72, so the two chips 52, 54 can be electrically connected to the solder balls 67 of the bottom substrate 62 and further electrically connected to the first external printed wiring broad. The connector 70 can be electrically connected to a side second external printed wiring broad.

It will be apparent to those skilled in the art that the semiconductor package according to the present invention is not limited to ball grid array, other types of packages, such as pin grid array (PGA), can also be provided with the connector for a multi-direction connection.

As the foregoing description, the semiconductor package according to the present invention is provided with connectors for the multi-direction connection. In particular, the semiconductor package can be adapted to the system in package (Sip) for providing an integrated electronic module.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A package for electrically connecting to an external printed wiring board and an external electronic device, said package comprising:
   a substrate having a first surface for electrically connecting to the external printed wiring board, and a second surface opposite to the first surface;
   a semiconductor chip disposed on and electrically connected to the substrate; and
   a connector disposed on the second surface of the substrate for electrically connecting the semiconductor chip to the external electronic devices;
   wherein the substrate comprises a plurality of solder balls which are disposed on the first surface of the substrate and electrically connected to the semiconductor chin for electrically connecting the semiconductor chin to the external minted wiring board when the external printed wiring board is connected to the substrate via said solder balls.

2. The package as claimed in claim 1, wherein the connector is disposed on and electrically connected to the substrate by a surface mount technology process.

3. The package as claimed in claim 1, wherein the semiconductor chip is electrically connected to the substrate by a wire bonding process.

4. The package as claimed in claim 1, wherein the semiconductor chip is electrically connected to the substrate by a flip chip technology process.

5. The package as claimed in claim 1, further comprising a molding compound for encapsulating the semiconductor chip.

6. The package of claim 1, further comprising a molding compound encapsulating said chip, wherein
   said molding compound and said connector are both disposed on the second surface of said substrate; and
   said connector is positioned completely outside said molding compound.

7. The package of claim 1, wherein said connector has a shape of a box including an internal space and an opening on a side of said box.

8. A package for electrically connecting to an external printed wiring board and an external electronic device, said package comprising:
   a first substrate;
   a first semiconductor chip electrically connected to the first substrate;
   a second substrate;
   a second semiconductor chip electrically connected to the second substrate;
   a medium substrate electrically connected to the first substrate and the second substrate; and
   a connector electrically connected to the first substrate and the second substrate, wherein the first substrate is electrically connected to the external printed wiring board and the connector is electrically connected to the external electronic device.

9. The package as claimed in claim 8, wherein the first substrate comprises a plurality of solder balls for electrically connecting to the external printed wiring board.

10. The package as claimed in claim 8, wherein the first substrate comprises a plurality of pins for electrically connecting to the external printed wiring board.

11. The package as claimed in claim 8, wherein the first semiconductor chip and the second semiconductor chip are electrically connected to the first and the second substrates by a wiring bonding process, respectively.

12. The package as claimed in claim 8, wherein the first and the second semiconductor chips are electrically connected to the first and the second substrates by a flip chip technology process, respectively.

13. The package as claimed in claim 8, further comprising a first molding compound and a second molding compound for encapsulating the first and second semiconductor chips, respectively.

14. The package of claim 8, wherein said first substrate is physically positioned above said medium substrate and said connector which, in turn, are physically positioned above said second substrate.

15. The package of claim 8, wherein said first and second substrates are physically separated by a gap and said first and said chips are positioned within said gap.

16. The package of claim 8, wherein said connector has a shape of a box including an internal space and an opening on a side of said box.

17. A package for electrically connecting to an external printed wiring board and an external electronic device, said package comprising:
- a substrate having a first surface for electrically connecting to the external printed wiring board, and a second surface opposite to the first surface;
- a semiconductor chip disposed on and electrically connected to the substrate; and
- a connector disposed on the second surface of the substrate for electrically connecting the semiconductor chin to the external electronic device;

wherein said substrate further comprises:
- first conductive elements on the first surface thereof for electrically connecting the chip to the external printed wiring board; and
- second conductive elements on the second surface thereof, said second conductive elements being electrically connected to said chip and said connector;

wherein said chip and said connector are physically attached to different regions on the second surface of said substrate.

* * * * *